United States Patent
Ha et al.

(10) Patent No.: US 11,792,924 B2
(45) Date of Patent: *Oct. 17, 2023

(54) PRINTED CIRCUIT BOARD AND MANUFACTURING METHOD THEREOF

(71) Applicant: SAMSUNG ELECTRONICS CO., LTD., Suwon-si (KR)

(72) Inventors: Taehyeun Ha, Suwon-si (KR); Taeje Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 159 days.

This patent is subject to a terminal disclaimer.

(21) Appl. No.: 17/319,633

(22) Filed: May 13, 2021

(65) Prior Publication Data

US 2021/0282262 A1 Sep. 9, 2021

Related U.S. Application Data

(63) Continuation of application No. 16/439,207, filed on Jun. 12, 2019, now Pat. No. 11,039,532.

(30) Foreign Application Priority Data

Jun. 14, 2018 (KR) .................. 10-2018-0068362

(51) Int. Cl.
*H05K 1/02* (2006.01)
*H01L 23/00* (2006.01)
*H01L 21/02* (2006.01)

(52) U.S. Cl.
CPC ..... *H05K 1/0289* (2013.01); *H01L 21/02288* (2013.01); *H01L 24/26* (2013.01); *H05K 1/028* (2013.01)

(58) Field of Classification Search
CPC .................................................. H05K 1/0289
(Continued)

(56) References Cited

U.S. PATENT DOCUMENTS 6,333,522 B1 12/2001 Inoue et al.
8,172,097 B2 5/2012 Nearman et al.
(Continued)

FOREIGN PATENT DOCUMENTS

JP 05-183291 A 7/1993
JP 08-250864 A 9/1996
(Continued)

OTHER PUBLICATIONS

Written Opinion (PCT/ISA/237) issued by the International Searching Authority in corresponding International Application No. PCT/KR2019/006877, dated Sep. 18, 2019.
(Continued)

*Primary Examiner* — Stanley Tso
(74) *Attorney, Agent, or Firm* — Sughrue Mion, PLLC

(57) ABSTRACT

Provided is a printed circuit board using thermally and electrically conductive layer, and a manufacturing method thereof. The manufacturing method for mounting a plurality of elements includes forming an electrode layer on a substrate of a PCB, forming a photo solder resist (PSR) layer in a patterned manner on a first area of the electrode layer; forming a conductive layer on the PSR layer in the patterned manner, the conductive layer being configured to conduct heat and static electricity; and mounting a plurality of elements on a second area of the side of the PCB, the second area being different from the first area.

16 Claims, 15 Drawing Sheets

(58) Field of Classification Search
USPC ........................................................ 174/255
See application file for complete search history.

(56) References Cited

U.S. PATENT DOCUMENTS

| | | | |
|---|---|---|---|
| 10,256,221 B2* | 4/2019 | Bibl ...................... | H01L 27/124 |
| 2004/0157438 A1 | 8/2004 | Yamashita et al. | |
| 2010/0096166 A1 | 4/2010 | Fjelstad | |
| 2011/0088928 A1* | 4/2011 | Lim ...................... | H05K 1/0263 |
| | | | 174/252 |
| 2014/0240926 A1 | 8/2014 | Choi | |
| 2015/0125786 A1* | 5/2015 | Lee ...................... | C03C 17/3441 |
| | | | 430/7 |
| 2016/0007486 A1 | 1/2016 | Kim et al. | |
| 2016/0041474 A1* | 2/2016 | Seong .................. | G03F 7/70058 |
| | | | 355/67 |
| 2019/0189880 A1 | 6/2019 | Lin | |

FOREIGN PATENT DOCUMENTS

| | | |
|---|---|---|
| JP | 2008-205453 A | 9/2008 |
| JP | 2009-253098 A | 10/2009 |
| KR | 10-1042441 B | 6/2011 |
| KR | 10-1059576 B1 | 8/2011 |
| KR | 10-2012-0070842 A | 7/2012 |
| KR | 10-2012-0139373 A | 12/2012 |
| KR | 10-1412617 B1 | 6/2014 |

OTHER PUBLICATIONS

International Search Report (PCT/ISA/210), issued by International Searching Authority in corresponding International Application No. PCT/KR2019/006877, dated Sep. 18, 2019.
Communication dated Mar. 18, 2021 by the European Patent Office in corresponding European Patent Application No. 19820407.5.
Communication dated Mar. 16, 2021 by the Korean Intellectual Property Office in corresponding Korean Application No. 10-2018-0068362.
Communication dated Sep. 17, 2021 by the Korean Intellectual Property Office in Korean Patent Application No. 10-2018-0068362.
Communication dated Sep. 21, 2021 by the Intellectual Property Office of India in Indian Patent Application No. 202017052917.
Communication dated Sep. 26, 2022 issued by the European Patent Office in European Patent Application No. 19820407.5.

* cited by examiner

PRINTED CIRCUIT BOARD AND MANUFACTURING METHOD THEREOF

CROSS-REFERENCE TO RELATED APPLICATION

This application is a Continuation of U.S. application Ser. No. 16/439,207 filed on Jun. 12, 2019, which is based on and claims priority under 35 U.S.C. § 119(a) of a Korean Patent Application number 10-2018-0068362, filed on Jun. 14, 2018, in the Korean Intellectual Property Office, and the disclosure of which is incorporated by reference herein in its entirety.

BACKGROUND

1. Field

The disclosure relates to a printed circuit board (PCB) and, more particularly, to the PCB using heat and electricity conductive layer and a manufacturing method thereof.

2. Description of Related Art

An electronic product, in which electrical components are mounted on a PCB having various materials, receives power and operates accordingly.

The PCB is a thin board in which electrical components such as an integrated circuit, a resistor, or a switch are soldered. A circuit used in most computers and the like is installed on the PCB. As for a type of ordinary PCB, an indication defined by the National Electrical Manufacturers Association (NEMA) is generally used, and the PCB may be classified according to a type of an insulating material of a board. For instance, the PCB may be classified into a paper phenol, a paper polyester, a paper epoxy, glass paper epoxy, glass-based epoxy, glass cloth epoxy, and the like.

When a plurality of elements are mounted on the PCB to compose a circuit through electrical components such as a light emitting diode (LED) element or an electronic element, the plurality of elements may be affected by electro-static discharge or operate by heating source to cause an electronic device to have an operation error.

Related art techniques employ reinforcement such as simple epoxy coating, a ground reinforcement design and an electro-static discharge (ESD) diode addition and the like in the optical technology for solving the problems of electro-static discharge and heat generation.

When an electronic element is installed or used, it is possible to generate damage to the electronic element due to the electro-static discharge generated from a user's hand or body. In addition, it is highly likely that the user's body may be affected by the heat generated in the electronic element, or the lifespan of a driving part may be shortened by the heat generation.

If the problem of electro-static discharge is to be solved by an ESD diode such as a transient voltage suppression (TVS) diode, the material cost may be raised, and the difficulty of designing a circuit is increased, resulting in an increase in the price of the PCB.

In particular, in the case of an electronic product, if a surface of an LED display product in which a plurality of LEDs are mounted on the PCB is applied with a protection layer to prevent external electro-static discharge from being generated, temperature inside the LED may rise, which may result in shortening of lifespan, and a cost of components may rise due to addition of a coating process. In addition, due to the high switching speed and high power consumption of the LED display, electromagnetic interference (EMI) that may affect the operation of a peripheral device may be generated. The technology to reduce the EMI is essential in the related field.

Accordingly, there is a need to address the above-mentioned problems such as the electro-static discharge problem occurring inside and outside as well as a heating problem generated from an electronic component.

SUMMARY

According to an aspect of the disclosure, there is provided a method of manufacturing a printed circuit board (PCB), the method comprising: arranging a substrate, forming an electrode layer on the substrate, forming a photo solder resist (PSR) layer in a patterned manner on a first area of a side of the electrode layer, forming a conductive layer on the PSR layer in the patterned manner, the conductive layer being configured to conduct heat and static electricity; and mounting a plurality of elements on a second area of the side of the PCB, the second area being different from the first area.

The conductive layer may include graphene material.

The method may further include forming a via hole which penetrates the PSR layer to connect the conductive layer and the electrode layer.

The substrate may include a flexible material, and the plurality of elements may include a micro LED.

A height of the conductive layer from the surface of the PCB may be greater than a height of one or more of the plurality of elements from the surface of the PCB.

The PCB may comprise a substrate made of a flexible material, and wherein the plurality of elements may comprise at least one micro light emitting diode.

The method may further comprise: connecting the conductive layer with a ground layer of the PCB.

The conductive layer may be formed using a silk screen method.

The conductive layer may be formed an ink jet printing method.

The conductive layer may be formed using a lithography method.

The method may further comprise: forming an additional conductive layer for conducting heat and static electricity on a third area different the first area and the second area.

According to another aspect of the disclosure, there is provided a printed circuit board (PCB) comprising: an electrode layer formed on a substrate; a photo solder resist (PSR) layer formed in a patterned manner on a first area of a side of the PCB; and a conductive layer formed on the PSR layer in the patterned manner, the conductive layer being configured to conduct heat and static electricity.

The conductive layer may include graphene material.

The PCB may further comprise: a via hole which penetrates the PSR layer to connect the conductive layer and the surface of the PCB.

The PCB may further comprise: a plurality of elements mounted on a second area of the side of the PCB, the second area being different from the first area, wherein a height of the conductive layer from the surface of the PCB may be greater than a height of one or more of the plurality of elements from the surface of the PCB.

The substrate may be made of a flexible material, and wherein the plurality of elements comprise at least one micro light emitting diode (LED).

The PCB may further comprise: a connecting element configured to connect the conductive layer with a ground layer of the PCB.

The conductive layer may be formed using an ink jet printing method.

The conductive layer may be formed using a lithography method.

The conductive layer may be formed using a silk screen method.

The PCB may further comprise: a plurality of elements mounted on a second area of the side the PCB, the second area being different from the first area, and an additional conductive layer formed on a third area of the side of the PCB, the third area being different the first area and the second area, and the additional conductive layer being configured to conduct heat and static electricity.

According to another aspect of the disclosure, there is provided a printed circuit board (PCB) comprising: a substrate; a photo solder resist (PSR) layer formed in a first pattern on a side of the substrate; a conductive layer formed on the PSR layer in a second pattern that is the same as the first pattern of the PSR layer, the conductive layer being configured to conduct heat and static electricity; and one or more elements mounted onto the side of the substrate through a space in the first pattern of the PSR layer and the second pattern of the conductive layer.

The PCB may further comprise: an electrode layer formed between the PSR layer and the conductive layer.

The PCB may further comprise: a via hole formed in the first pattern of the PSR layer and the second pattern of the conductive layer, the via hole reaching a surface of the PCB.

According to another aspect of the disclosure, a method of forming a printed circuit board (PCB) comprising: forming a substrate; forming a photo solder resist (PSR) layer in a first pattern on a side of the substrate; forming a conductive layer on the PSR layer in a second pattern that is the same as the first pattern of the PSR layer, the conductive layer being configured to conduct heat and static electricity; and mounting one or more elements onto the side of the substrate through a space in the first pattern of the PSR layer and the second pattern of the conductive layer.

The method may further comprise: forming an electrode layer between the PSR layer and the conductive layer.

The method may further comprise: forming a via hole in the first pattern of the PSR layer and the second pattern of the conductive layer, the via hole reaching a surface of the PCB.

BRIEF DESCRIPTION OF THE DRAWINGS

The above and other aspects, and advantages of certain embodiments of the present disclosure will be more apparent from the following description taken in conjunction with the accompanying drawings, in which.

DETAILED DESCRIPTION

Figure 1A:
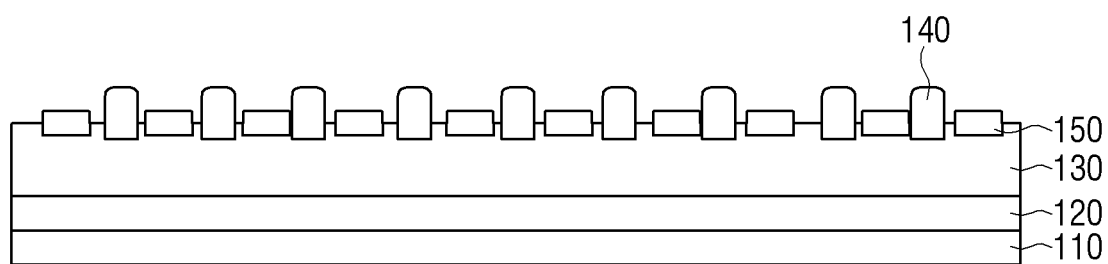
FIG. 1A is a view to describe a printed circuit board (PCB) according to an embodiment.

Hereinafter, embodiments of the disclosure will be described with reference to the accompanying drawings. However, it may be understood that the disclosure is not limited to the embodiments described hereinafter, but includes various modifications, equivalents, and/or alternatives of the embodiments of the disclosure. In relation to explanation of the drawings, similar drawing reference numerals may be used for similar constituent elements.

In the description, the terms "first, second, and so forth" are used to describe diverse elements regardless of their order and/or importance and to discriminate one element from other elements, but are not limited to the corresponding elements. For example, a first user appliance and a second user appliance may indicate different user appliances regardless of their order or importance. For example, without departing from the scope as described herein, a first element may be referred to as a second element, or similarly, a second element may be referred to as a first element.

It is to be understood that an element (e.g., a first element) is "operatively or communicatively coupled with/to" another element (e.g., a second element) is that any such element may be directly connected to the other element or may be connected via another element (e.g., a third element). On the other hand, when it is mentioned that an element (e.g., a first element) is "directly connected" or "directly accessed" to another element (e.g., a second element), it can be understood that there is no other element (e.g., a third element) between the other elements.

The terms used in the description are used to describe an embodiment, but may not intend to limit the scope of other embodiments. Unless otherwise defined specifically, a singular expression may encompass a plural expression. All terms (including technical and scientific terms) used in the description could be used as meanings commonly understood by those ordinary skilled in the art to which the disclosure belongs. The terms that are used in the disclosure and are defined in a general dictionary may be used as meanings that are identical or similar to the meanings of the terms from the context of the related art, and they are not interpreted ideally or excessively unless they have been clearly and specially defined. According to circumstances, even the terms defined in the embodiments of the disclosure may not be interpreted as excluding the embodiments of the disclosure.

Hereinbelow, various embodiments will be further described with reference to the attached drawings. FIG. 1A is a view to describe the PCB according to an embodiment.

Referring to FIG. 1A, a PCB 100 may have a multi-layer structure. For example, the PCB 100 may include a substrate 110, an electrode forming layer 120, a photo solder resist (PSR) layer 130, a conductive layer 140, and an element layer 150.

The substrate 110 is a thin disc that is a material of a semiconductor and is also referred to as a wafer. The substrate 110 is made of paper phenolic (FR-2, FR-3, etc.), epoxy (FR-4, FR-5, G-2, G-11, and the like), polyamide, BT, metal, teflon, ceramic, halogen free, and the like. A substrate is mainly made of FR-4, which is an insulator. FR-4 is an abbreviation of flame retardant 4 and made of glass fiber and resin. FR4 is fire-resistant, cheap, and has low-conductivity. However, embodiments are not limited thereto. In the case of designing a circuit using a superhigh frequency (SHF), a material other than FR-4 may be used as a substrate. In addition, two or more materials may be combined or the substrate may be formed of a flexible material other than the above material.

The electrode forming layer 120 is a layer for forming electric wires between elements in a circuit, and may be formed on the entire surface of the substrate 110 so as to form inter-element electrodes at all positions on the PCB 100. The electrode forming layer 120 mainly uses copper, but is not limited thereto. The electrode forming layer 120 may be formed on both sides of the substrate 110 with a layered structure.

The PSR layer 130 is a mask layer for preventing bridges from being generated during soldering to mount elements and for preventing oxidation and contamination of exposed circuits. Generally, in the process of manufacturing the PCB, in order to protect a circuit formed on the surface of the PCB, and prevent solder bridge phenomenon between circuits in the soldering process conducted to mount components on the PCB, a process of printing photo solder resist (PSR) mask ink on a surface of the PCB prior to mounting the components after manufacturing the PCB is performed. That is, the PSR printing process is a process for improving the recognition performance of the chip mounting area in a surface mount technology (SMT) process, which is a post-process for the PCB on which an internal circuit is formed. The PSR printing process plays an important role in manufacturing an LED lighting element or hard PCB. Although it has been described that the PSR layer 130 is layered on all areas of the electrode forming layer 120 in the drawings, the PSR layer 130 may be layered and formed only on an area where the electronic elements are not mounted on the electrode forming layer 120.

The conductive layer 140 is a layer formed by using a material having good thermal and electrical conductivity characteristics in an area where no electrode is present. For example, a graphene solvent may be used as a material having good thermal and electrical conductivity and excellent EMI shielding performance, but is not limited thereto. Graphene is an element which has been studied actively in recent years and applied in various industrial fields. Graphene is manufactured by mechanical and physical methods using carbon-based materials. It has excellent properties in terms of strength, electrical conductivity, thermal conduction characteristics, EMI shielding effect, etc., as compared to the materials which have been used in the conventional industry. As graphene shows excellent properties with a low price in consideration of materials having the same purpose, it is said that graphene will be used for diverse purposes. In particular, graphene may be processed in a powder form or ink form and thus is suitable for painting on the surface of a product. The graphene solvent may form a conductive layer in a manner suitable for implementing a silk screen method or a fine pattern. According to an embodiment, by forming a conductive layer on the PSR layer pattern using a silk screen method or the like, a conductive layer may be formed without a separate insulating layer. This will be described in detail later.

The electronic element 150 is an element to be mounted on the PCB 100. In FIG. 1A, it has been described that the electronic element 150 is layered on an upper portion of the PSR layer 130, but the electronic element 150 may form a circuit among elements which are directly connected to the electrode forming layer 120 and mounted. In other words, the PSR layer 130, and the conductive layer 140 may be formed only in areas excluding an area where the electronic element is to be mounted, and the electronic element 150 may be directly connected to the electrode forming layer 120 in an area where the element will be mounted.

The electronic element 150 may include a semiconductor element such as an LED element and a micro LED element, and a power supply device such as a switching mode power supply (SMPS), but is not limited thereto, and may include a resistor, a capacitor, an inductor, a vibrator, and the like.

A micro LED among elements mounted on the PCB is generally defined as an LED manufactured at a level of 10 to 100 um. An LED manufactured through a thin film growth on a sapphire or a silicon substrate with inorganic materials such as Al, Ga, N, P, and As, and In has a disadvantage of being damaged by external shock and bending. However, it is possible to integrate less than a few um of active/passive elements in a foldable or flexible display by making the size very small such as a micro LED or attaching them to a flexible substrate.

A next generation display may be defined as implementing performance distinctive over an existing flat panel display, such as a flexible display. An organic light emitting diode (OLED) as the next generation display may show faster response speed compared to a liquid crystal display (LCD), have little residual image during a moving picture reproduction, not require a backlight due to self-emission, and implement a slim design and a clearer image quality. In order to reduce power consumption of a display in a portable device, high-efficiency pixels are required.

In a wearable device, miniaturization, lightweight, and reduction are key points, and a micro LED display having high daytime visibility draws an attention. In addition, the field of the micro display is a head mount display (HDM), a smart glass, and a medical device, etc., requiring high-resolution driving technology, and a large-sized display for advertisement and information transfer purposes requires free installation and high brightness performance. In order to implement a micro display, a high-density LED arrangement technique is required.

As a method for transferring the micro LED onto the PCB 100, there is a direct transfer and a printing transfer. The direct transfer is a technique for directly bonding a material or a thin film to be transferred to a target substrate, and the printing transfer is defined as a technique for utilizing an intermediate medium such as an electrostatic stamp or a bonding stamp. The representative technique for direct transfer and the printing transfer is as follows:

The direct transfer refers to a method in which a p-type gallium nitride (GaN) is separated into micro sizes by an etching process and then is directly bonded to the PCB 100 in which a fine switching element such as complementary metal-oxide semiconductor (CMOS) is formed. If necessary, a silicon or sapphire substrate used as a growth substrate may be removed, and a plurality of micro-sized GaN individual elements separated by a single size may be manufactured to easily control an operation current by combining with a switching microelectronic element. This method is advantageous in that the LED manufacturing and transferring methods are easy, but the quality management of each element is a very important factor.

There may be two methods in a printing type transfer method. The first is using an electrostatic head. The principle of using the electrostatic head is causing adhesion with the micro LED by charging phenomenon by applying a voltage to a head portion made of a silicon material. This method is advantageous in that a desired area or a single element may be selectively transferred, but there may be a problem of damages to the micro LED due to charging phenomenon by voltage applied to a head during electrostatic induction. The second method is transferring the LED to the PCB 100 by applying a polymer material to a transfer head. Compared to the electrostatic head method, there is no problem on the LED damage, however, there is a disadvantage in that, in the transfer process, the micro LED may be stably transferred only if the adhesion force of the elastic transfer head is greater than the adhesion force of the PCB 100, and in that an additional process for forming an electrode is required.

Another example of the electronic element 150 mounted on the PCB 100 is a direct current (DC) power supplier. The DC power supplier is largely classified into a linear power supply (LPS) and a switched mode power supply (SMPS). The SMPS method suitable for light weight and miniaturization is used as a main power supplier for household electronic products and PCs.

The SMPS is a power supplier using a switch control method for converting alternating current (AC) power to DC power by using a switching transistor, or the like. Compared to the linear power supply (LPS), the SMPS has a large amount of electromagnetic waves, but is advantageous in that there is little heat generation. According to an embodiment, by forming a conductive layer on the PCB, heat which may be generated when a power supply by LPS is mounted may be effectively discharged. According to an embodiment, by forming a conductive layer on the PCB, electromagnetic waves which may be generated when a power supplier by the SMPS is mounted may be effectively blocked. However, the effect of the embodiment is not limited thereto, and even when a power supply is mounted by the SMPS, heat and electro-static discharge may be generated. In order to effectively control the heat and electro-static discharge, the conductive layer may be formed.

Referring to FIG. 1A, the conductive layer 140 may be formed by adjusting the height so as to protrude more than the mounted electronic element 150. As the conductive layer 140 protrudes more than the electronic element 150, in the process of mounting the electronic element 150, the user's hand may be in contact with the conductive layer 140 before the PCB, and there is an effect of reducing shock or ESD which may occur by friction between the hand and the PCB. The conductive layer 140 may be formed higher than the electronic element 150 by applying an increased amount of the conductive material.

Figure 1B:
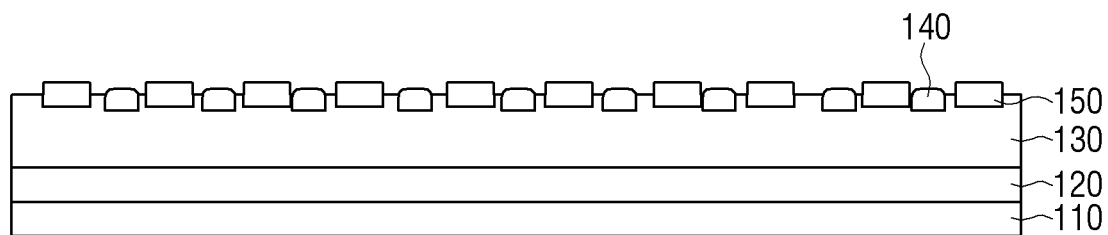
FIG. 1B is a view to describe a printed circuit board (PCB) according to an embodiment.

However, this is merely exemplary, and the height of the conductive layer 140 may be lower than the height of the electronic element 150 as illustrated in FIG. 1B. In this case, there is an effect that the user may mount the electronic element 150 without interference due to the friction with the conducive layer 140.

Figure 2:
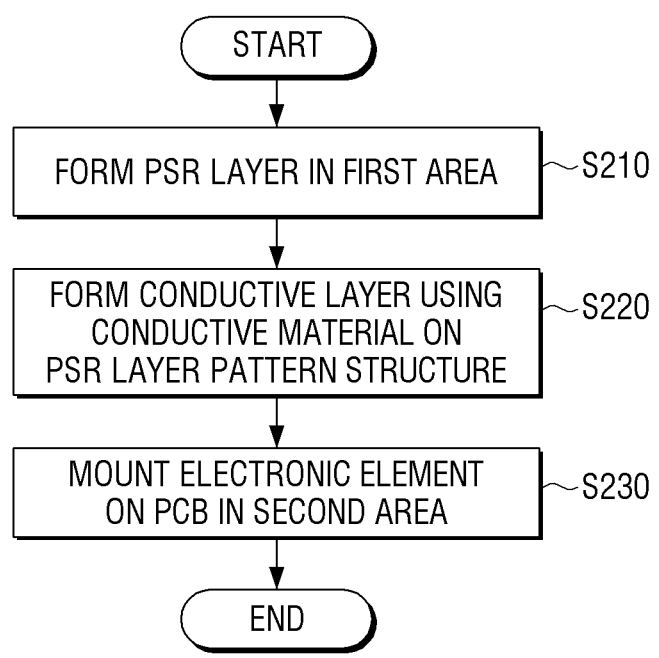
FIG. 2 is a block diagram to describe a method of forming the PCB.

FIG. 2 is a block diagram to describe a method of forming the PCB.

The PCB 100 includes the substrate 110 and the layers stacked above and below the substrate 110. In the PCB 100, a structure in which the electrode forming layer 120 is layered on the substrate 110 is a basic structure.

The PSR layer 130 may be formed on a first area excluding an area in which the electronic element is to be mounted, from among areas on the PCB 100 in operation S210. Here, the first area may be all the areas on the PCB 100 except an area on which the electronic element is mounted, or a partial area on the PCB 100 except an area on which the electronic element is mounted. At this time, the PSR layer 130 may be formed on the PCB 100 in a structure including a fine pattern.

The conductive layer 140 may be formed using a conductive material on an area where the PSR layer 130 is formed in operation S220. In other words, the conductive layer 140 may be formed in the same structure on all areas on which the PSR layer 130 is formed, or formed in a partial area from among the areas on which the PSR layer 130 is formed. According to an embodiment, the conductive layer 140 may be formed in part on an area where the PSR layer 130 is not formed for the purpose of grounding as described later.

In order to form the conductive layer 140, a silk screen method, an ink jet printing method and a lithography method may be used for a conductive material. In the case of coating a conductive material using the methods described above, unlike the related-art spin technique, a separate insulating layer is not required.

After the conductive layer 140 is formed, the electronic element may be mounted on a second area on the PCB 100 in operation S230. Here, the second area may be all areas on the PCB 100 except the first area, or may be a partial area among areas other than the first area. In other words, the electronic element may be mounted to be directly connected to the electrode forming layer 120, in an area where the PSR layer 130 and the conductive layer 140 are not formed, and form a circuit.

Figure 3A:
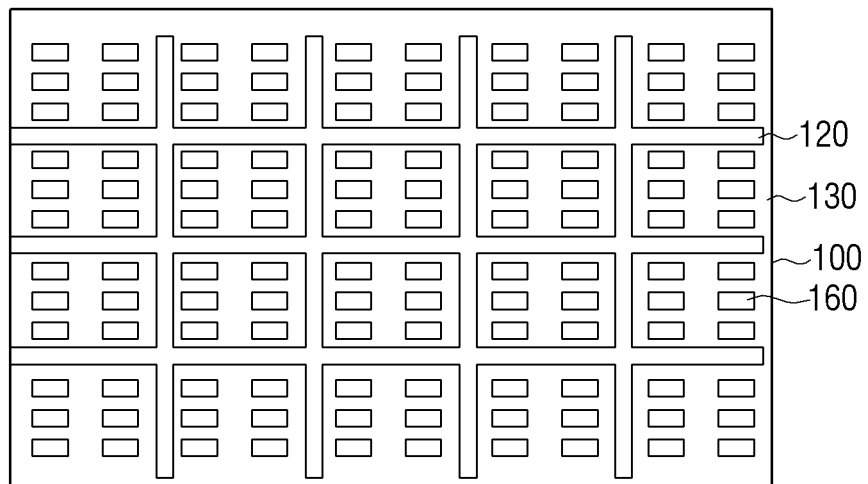
FIG. 3A is a view to describe a method for forming a conductive layer on the PCB according to an embodiment.
Figure 3B:
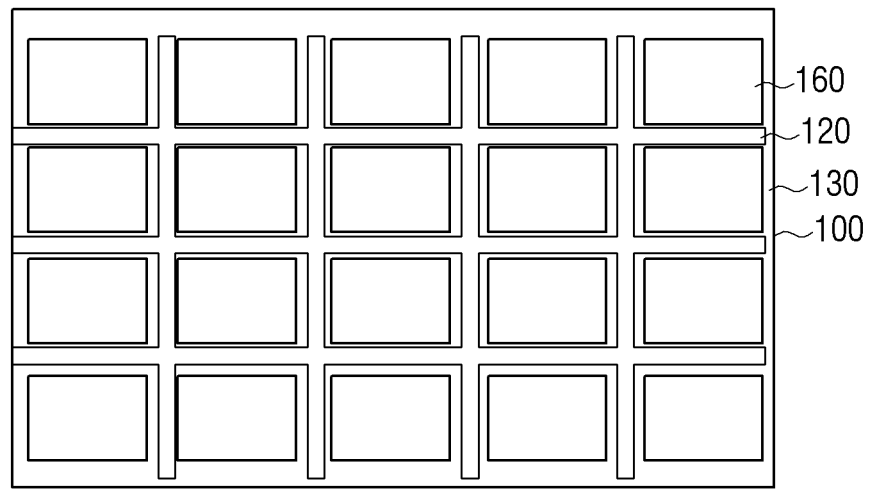
FIG. 3B is a view to describe a method for forming a conductive layer on the PCB according to an embodiment.
Figure 3C:
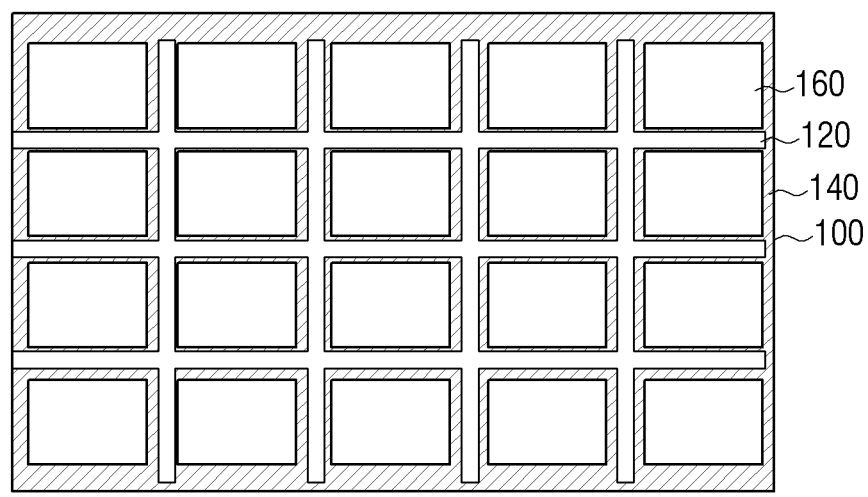
FIG. 3C is a view to describe a method for forming a conductive layer on the PCB according to an embodiment.

FIGS. 3A, 3B, and 3C are views to describe a method for forming a conductive layer on the PCB according to an embodiment.

FIG. 3A is a view illustrating the PSR layer 130 formed on the PCB 100. Referring to FIG. 3A, the electrode forming layer 120 may be layered and formed on the entire upper surface of the substrate 110. The PSR layer 130 may be layered and formed with a certain pattern on a partial area except an area 160 in which a plurality of elements 150 are mounted on the electrode forming layer 120 to form an electrode.

FIG. 3B is a view illustrating that the electronic element 150 is mounted on the PCB 100 after the PSR layer 130 is formed. Referring to FIG. 3B, the electronic element 150 may be directly connected to the electrode forming layer 120 through an area where the PSR layer 130 is not formed, and mounted on the PCB 100. According to an embodiment, the electronic element 150 may be directly physically connected to the electrode forming layer 120 through an area where the PSR layer 130 is not formed, and mounted on the PCB 100. According to an embodiment, the electronic element 150 may be directly electrically connected to the electrode forming layer 120 through an area where the PSR layer 130 is not formed, and mounted on the PCB 100. The electronic element 150 mounted on the PCB 100 may generate heat at a high temperature as the circuit is driven and may generate electro-static discharge through contact between the human body and the PCB 100 during the mounting of the electronic element 150. Such heat and electro-static discharge may cause shortening of lifespan or degradation of performance of the electronic element 150. Thus, a material having high thermal and electrical conductivity may be additionally formed on the PCB 100 to effectively discharge heat and static electricity on the PCB 100. In addition, a material having high electrical conductivity may be added to the PCB 100 to improve electromagnetic interference caused by high-speed switching of the electronic element.

FIG. 3C is a view illustrating that the electronic element 150 is mounted after the conductive layer 140 is formed on the PSR layer 130. Referring to FIG. 3C, the conductive layer 140 may be formed on the PSR layer 130 formed as shown in FIG. 3A so as not to contact the electrode forming layer 120. At this time, the conductive layer 140 may be formed in the same area as the PSR layer 130, or may be formed in only a part of the area where the PSR layer 130 is formed, if necessary. As described above, by forming the conductive layer 140 on the PSR layer 130, it is possible to effectively conduct the heat generated due to the driving of the electronic element 150 and the static electricity that may occur due to various reasons and discharge the static electricity to outside. Referring to FIG. 3C, the electronic element 150 may be directly connected to the electrode forming layer 120 through an area where the conductive layer 140 and the PSR layer 130 are not formed, and mounted on the PCB 100. According to an embodiment, the electronic element 150 may be directly physically connected to the electrode forming layer 120 through an area where the conductive layer 140 and the PSR layer 130 are not formed, and mounted on the PCB 100. According to an embodiment, the electronic element 150 may be directly electrically connected to the electrode forming layer 120 through an area where the conductive layer 140 and the PSR layer 130 are not formed, and mounted on the PCB 100.

Figure 4:
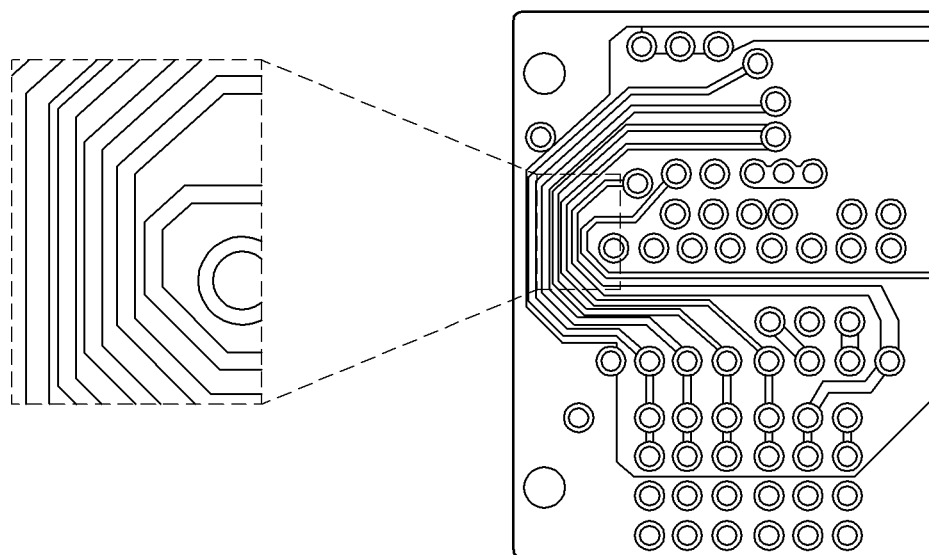
FIG. 4 is a view illustrating an example of the PSR layer having a fine and complicated pattern.

The pattern of the PSR layer 130 may be a simple pattern as shown in FIG. 3A, but this is merely an example, and the PSR layer 130 may have a fine and complex pattern as shown in FIG. 4. In this case, there could be a problem in the method of forming the conductive layer 140 on the pattern of the PSR layer 130.

Figure 5:
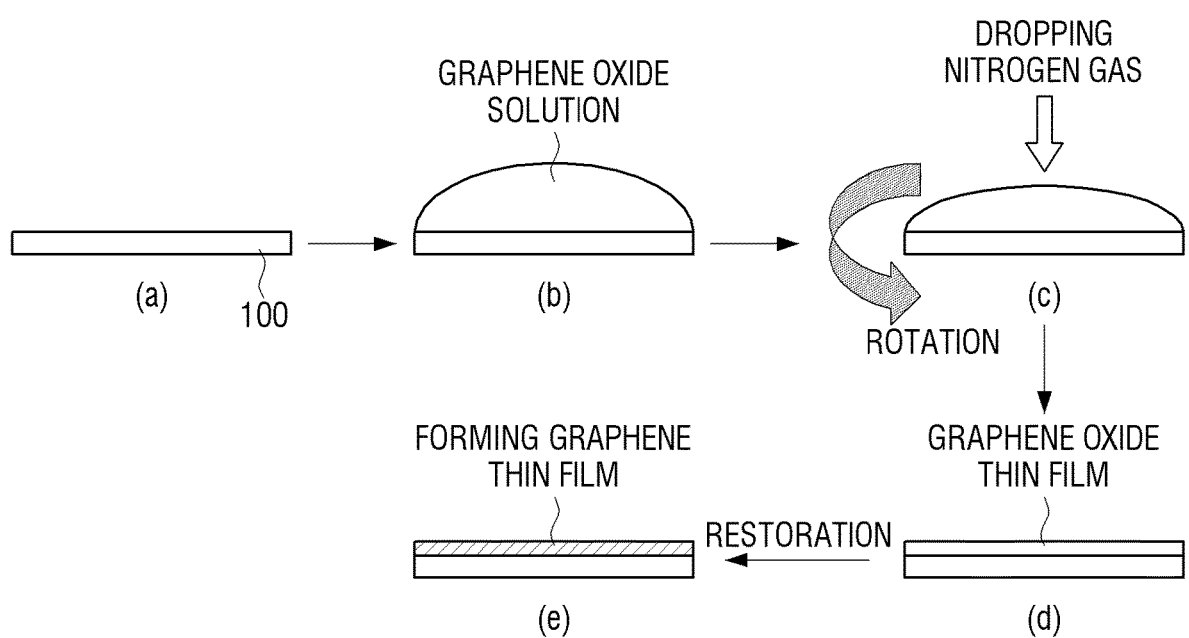
FIG. 5 is a view to describe a related-art spin technique.

FIG. 5 illustrates a spin coating method used to form a conductive layer for conducting heat and electricity. Spin coating is a thin film formation method in which a solution is dropped on a rotating substrate, and most of the solution is removed by the angular velocity of the substrate and the thin film is remained. Thin film formation mechanism is complicated, but it has excellent reproducibility and is advantageous in the drying process, so that it is possible to produce a large space uniformly by spin coating. Specifically, as illustrated in FIG. 5, a process of forming a graphene thin film on the PCB 100 using spin coating is as follows. The graphene oxide solution is dropped onto the PCB 100 and rotated at high speed in a nitrogen gas environment. The conductive layer 140 may be formed on the PCB 100 by reducing the oxidized graphene thin film on the PCB 100 formed thereafter.

However, when the conductive layer is formed by the spin coating method, the conducive layer 140 cannot but be formed not only on an area where the PSR layer 130 is formed, but also an area of the electrode forming layer 120 in which the PSR layer 130 is not formed for mounting the electronic element 150. The conductive layer 140 uses a material having high thermal and electrical conductivity such as graphene, and if the conductive layer 140 is formed on the electrode forming layer 120, a circuit may not be connected normally, even after the electronic element 150 is mounted. Therefore, if the spin coating method is used, an additional insulating layer should be formed between the PSR layer 130 and the conductive layer 140.

That is, in the related art, additional time and cost are required for a process to form an additional insulating layer. In addition, by performing the spin coating, conductive material is wasted because a layer is inevitably formed even on an area which is not necessary.

According to an embodiment, a conductive material having excellent heat and electrical conductivity may be directly applied on the PSR layer 130 by a silk screen method, an ink jet printing method, and the like. According to the embodiment, time and cost are reduced since a process to form an additional insulating layer is not necessary and the conductive material is not wasted because a layer is not unnecessarily formed on an area that does not need the conductive material.

Figure 6A:
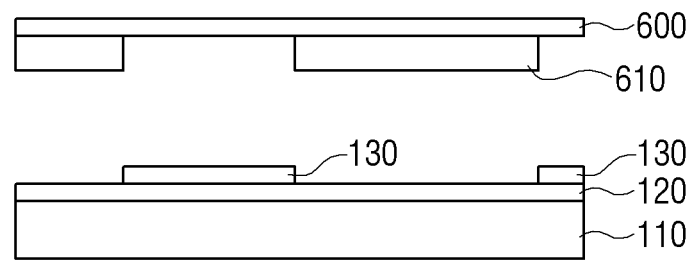
FIG. 6A is a view to describe a method of forming a conductive material with a conductive layer through a silk screen method according to an embodiment.
Figure 6B:
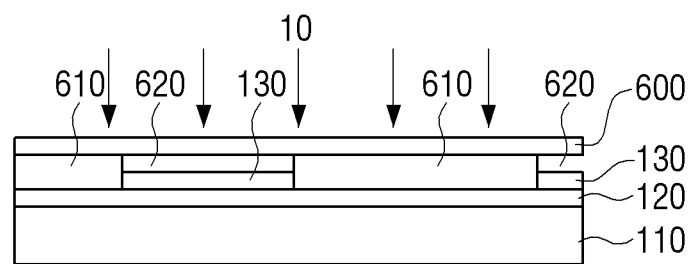
FIG. 6B is a view to describe a method of forming a conductive material with a conductive layer through a silk screen method according to an embodiment.
Figure 6C:
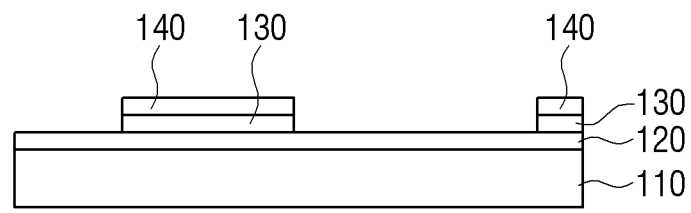
FIG. 6C is a view to describe a method of forming a conductive material with a conductive layer through a silk screen method according to an embodiment.

FIGS. 6A, 6B, and 6C are views to describe a method of forming a conductive material with a conductive layer through a silk screen method.

FIG. 6A is a view to describe a process of manufacturing the silk screen plate 600 and a process of printing the conductive material using the silk screen plate 600. First, the process of manufacturing the silk screen plate 600 shown in FIG. 6A may include an operation of tightly fixing a silk fiber yarn, a general chemical fiber yarn, or a woven net screen, or the like to a fixing frame. Further, the process may include applying a photosensitive liquid 610 uniformly on the entire surface of the silk screen plate 600 and drying the same. In addition, the process may include an operation of bringing a film in which an image of an arbitrary pattern or various characters is photographed into contact with the coating layer coated with a coating solution and an operation of irradiating light. Thereafter, by spraying water on the coating layer coated with a coating solution to be washed, it is possible to make only the image portion de-coated.

FIG. 6B illustrates a process of printing a conductive material using the manufactured silk screen plate 600. According to an embodiment, the manufactured silk screen plate 600 may be brought close to the surface of the PCB on which the PSR layer 130 is formed on the electrode forming layer 120, and the conductive material 10 may be applied onto the silk screen plate 610 which is close to the PCB. When the conductive material 10 is pushed using a squeegee, the conductive material 10 dispersed by the squeegee is transmitted to a de-coated portion 620, that is, the portion in which a shape or character is formed, and may be printed on the surface of the PCB 100 (the first process). Finally, a mask on which the desired print pattern is formed is placed on the PCB 100 on which the conductive material 10 is printed, the conductive material is dried, exposed and developed (the second process), and the conductive layer 140 may be finally formed on the surface of the PCB 100.

As another conductive material printing method, the silk screen plate 600 made of a silk fiber yarn, a general chemical fiber yarn, or a woven net screen or the like is directly disposed on the surface of the PCB, the conductive material 10 is applied to the silk screen plate, the conductive material 10 is pushed toward the surface of the PCB 100 using the squeegee so that the conductive material 10 is printed on the PCB surface (the first process), and then, a mask on which a print pattern of the conductive material layer 140 to be printed on the PCB is finely formed is placed on the PCB on which the conductive material 10 is printed. Then, the conductive material is dried, exposed, and developed (the second process), and the conductive layer may be formed finally on the surface of the PCB.

That is, the first method is a printing method in which the conductive layer 140 is formed on the surface of the PCB using the silk screen plate 600 in which a de-coated portion is formed on the silk screen. The second method is a conductive material printing method in which the conductive layer 140 is formed on the surface of the PCB using the silk screen plate 600 in which the de-coated screen is not formed. In the case of the first method, a developing process using a mask may be omitted. However, for the purpose of acquiring a fine print pattern or for forming a pattern such as another hole (for example, a via hole to be described later) in a print pattern formed by a conductive material, the developing process using a mask as described above may be added.

The silk screen plate 600 has a limited thickness due to limitation of the material thereof. Accordingly, in the conductive material printing method as described above, the process of printing the conductive material 10 on the PCB (the first process) may be repeated a plurality of times in order to adjust the thickness of the conductive layer 140. That is, primarily, the conductive material 10 is deposited on the surface of the PCB using the silk screen plate 600 and dried, and secondarily, the conductive material 10 is deposited on the surface of the PCB and dried. The first process may be repeatedly performed until the desired thickness of the conductive layer 140 is reached. If the desired thickness of the target conductive layer 140 is acquired by repeating the first process, the conductive layer 140 having a desired thickness and shape may be formed on the surface of the PCB by performing the dying, exposing, and developing process (the second process) as described above.

As a method of forming the conductive layer of the fine pattern, an ink jet printing method may be used, in addition to the method using the silk screen. In the ink jet printing method, in order to form the conductive layer, conductive material may be sprayed from a fine nozzle and coated, without direct physical contact. Specifically, a piezoelectric element at the rear portion of the nozzle is bent when receiving an electric current, so that the conductive material may be ejected out of the nozzle. The ejected conductive material may be coated on the PSR layer on the PCB. By this method, the PCB may form a conductive layer having a fine pattern structure through the ink jet printing method, even if a separate insulating layer is not included.

In the case of the ink jet printing method, it may happen that an ink jet head is clogged when particles of the ink (or the conductive material) for ejection are large. To prevent this, the graphene layer may be peeled off using liquid phase exfoliation (LPE), the graphene layer may be separated by an ultracentrifuge, and all the particles which have a size (now >1 um) that may clog the ink jet print heads may be filtered to be removed. Then, the graphene foil may be used as a material to make graphene-polymer ink and may be printed using ink jet printing.

As a method for forming a conductive layer of a fine pattern, a photolithography method may be used, in addition to the method using a silk screen or the ink jet printing method.

Although the PSR layer 130 includes a fine pattern through the above-described processes, the PCB 100 may disperse heat and static electricity without a separate insulating layer by selectively coating a conductive material having a high thermal and electrical conductivity only the upper area where the PSR layer 130 is formed. However, this is merely exemplary, and a structure in which the conductive layer 140 is formed may be diverse. For example, the conductive layer 140 may be partially layered even on an area where the PSR layer 130 is not formed, in addition to being layered on only the upper part of the PSR layer 130. That is, the PCB is advantageous in that an additional insulating layer is not required, as the conductive layer is layered on the upper part of the PSR layer, but a conductive material may also be formed in an area where no PSR layer is formed for the purpose of forming a ground.

Specifically, the PCB 100 may have a two-layer structure in which the conductive layer 140 is formed on the top and bottom surfaces, respectively, for pattern connection of the PSR layer with the PCB 100 formed on the top and bottom surfaces therebetween. A predetermined ground hole may be formed at one end of the PCB 100, and inside the ground hole, the conductive layer 140 formed on the upper surface and the lower surface of the PCB 100 may be connected to each other, and the conductive material identical with the conductive layer 140 may be formed in a shape of a bridge to enable grounding.

Here, the bridge-shaped connecting portion may be formed by spot welding one end of the portion where the ground hole is formed. The spot welding is a method of stacking conductive materials and applying a current through an upper electrode and a lower electrode, and then attaching only a portion of the conductive materials. As such, when a current is supplied to the conductive material after finishing the ground hole provided in the PCB 100 by applying the spot welding method as described above, the conductive material is instantaneously melted to form the connecting portion, and the grounding portion may be easily formed.

Figure 7:
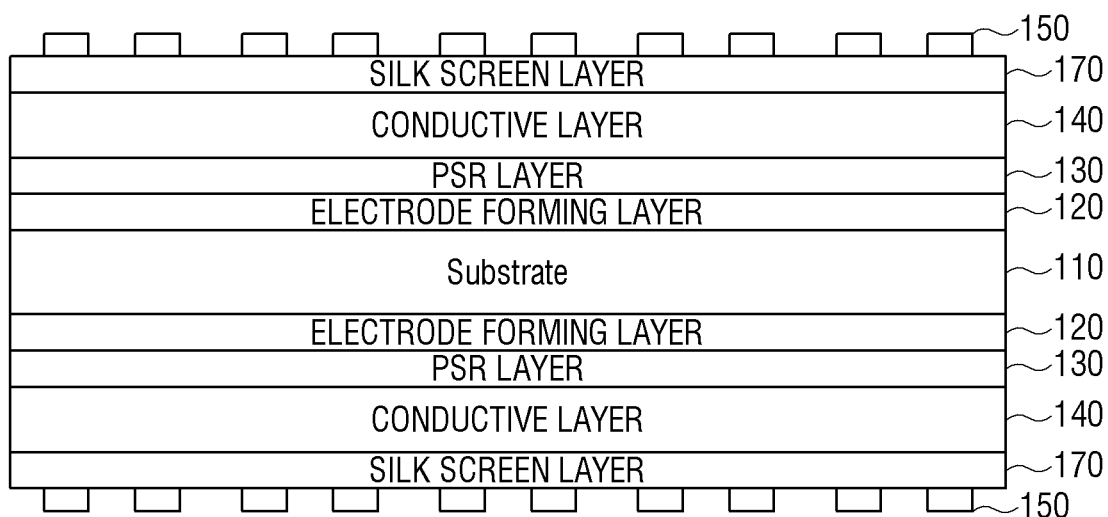
FIG. 7 is a view to describe a structure of the PCB including a silkscreen layer according to an embodiment.

FIG. 7 illustrates the PCB 100 in a multi-layer structure including the silk screen layer 170, according to an embodiment.

Referring to FIG. 7, the electrode forming layer 120 may be formed on both sides of the substrate 110 with a layered structure, and the PSR layer 130 may be formed on the electrode forming layer 120. The layered structure on the substrate 110 of the PCB 100 has been already described with reference to FIG. 1, and will not be further described.

The silkscreen layer is mainly formed of white color material, and may be formed on the PSR layer 130 and the conductive layer 120. In the silkscreen layer 170, characters, numbers, symbols, or the like, are written on the PCB to enable easy assembling and better understanding of the circuit. That is, the silkscreen layer 170 may display a position symbol or a region of each element.

Referring to FIG. 7, the electronic element 150 is illustrated as being layered on an upper portion of the silk screen layer 170, but the electronic element 150 may be directly connected to the electrode forming layer 120 to form a circuit between the mounted elements. That is, the PSR layer 130, the conductive layer 140, and the silk screen layer 170 may be formed only on a region except the region where the element is to be mounted, and the electronic element 150 may be directly connected to the electrode forming layer 120 in a region where the element is to be mounted.

Figure 8A:
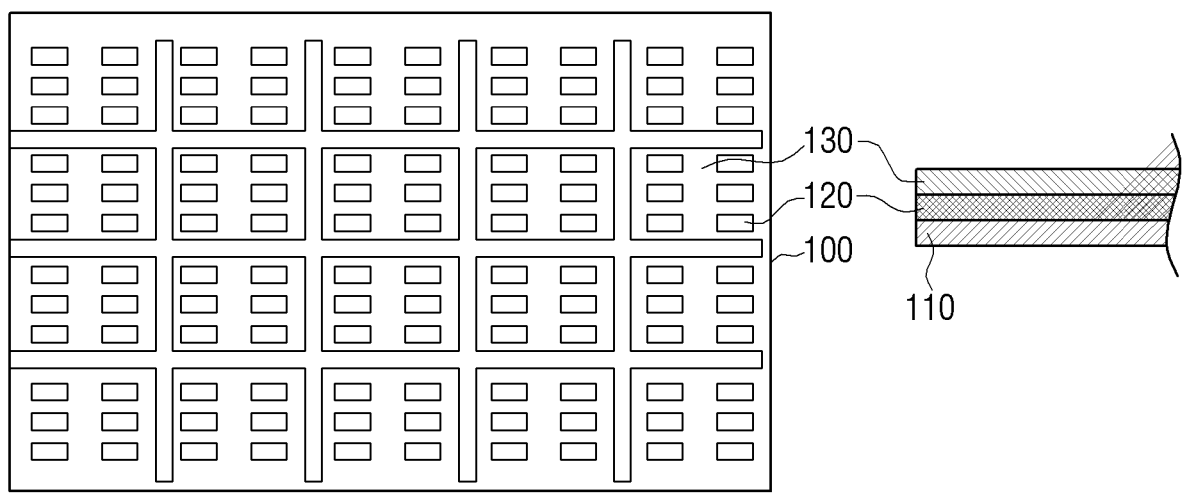
FIG. 8A is a view to describe a method for forming a via hole on the PCB according to an embodiment.
Figure 8B:
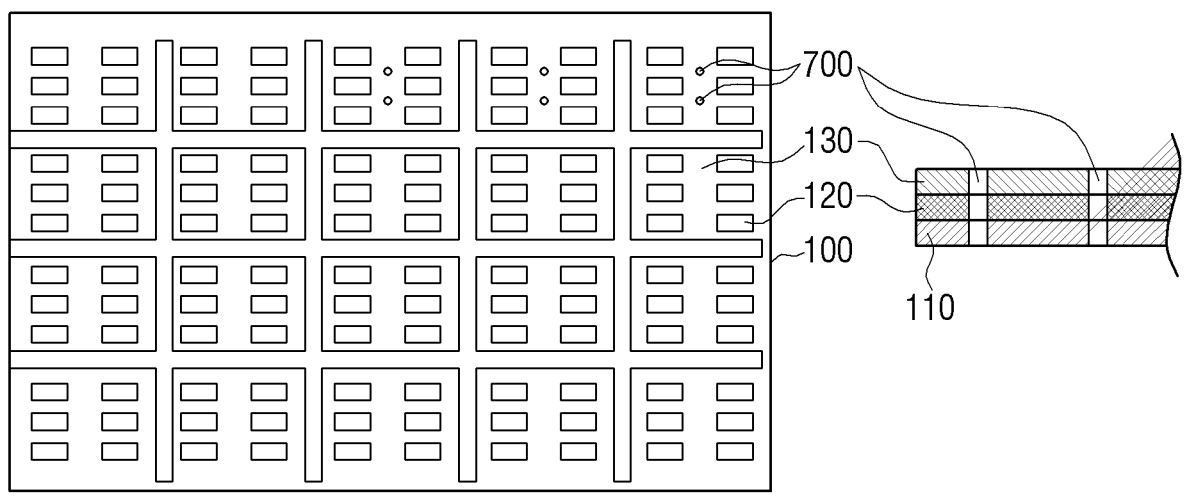
FIG. 8B is a view to describe a method for forming a via hole on the PCB according to an embodiment.
Figure 8C:
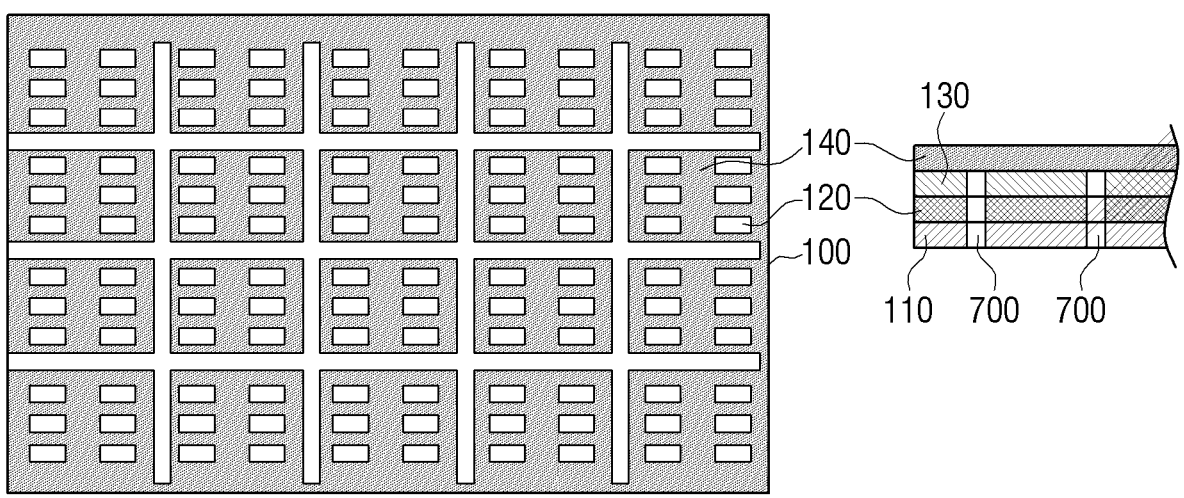
FIG. 8C is a view to describe a method for forming a via hole on the PCB according to an embodiment.

In order to more effectively control the heat and electrostatic discharge, a via hole may be formed on the PCB 100. FIGS. 8A to 8C are views to describe a method for forming a via hole on the PCB according to an embodiment.

A punched hole in the PCB (hereinafter called a "via hole") generally refers to a blind via hole formed on a surface and a via hole formed in an inside layer in manufacturing a multi-layer PCB. The via hole allows an electric signal to be exchanged between an upper surface and a lower surface of an electrode forming layer or between an inner layer and an outer layer. A via hole is generally processed by a drilling or punching method on a disk, and then a copper plate is processed on the inner periphery of the via hole so as to have conductivity, and then an insulating ink is filled in an empty space inside the via hole. The via hole is formed for electrical connection between each chip or between components in the PCB. The via hole may be formed only in a layer where a connection is required without penetrating the surface of the double-sided or multi-layered PCB, thereby enabling application of an electric current with the copper plate layered on the PCB.

Referring to FIG. 8A, the PCB may connect the conductive layer 140 (or a graphene layer) with the electrode forming layer 120 (or a copper layered plate) through a via hole, in order to increase the efficiency of heat and electrical conductivity of the conductive layer 140.

FIG. 8A illustrates the PCB 100 disposed innermost layer of the build-up PCB in which the substrate 110 on which ordinary electrode forming layer 120 and the PSR layer 130 are layered is cut into a predetermined standard. The PCB has a predetermined standard according to a product on which the PCB is to be mounted. In general, a working board may be cut into a square structure of a proper size so as to be suitable for the characteristics of the process.

FIG. 8B is a view illustrating the via hole 700 being formed on the PCB 100. The punching method of the via hole 700 may include melting a surface of the electrode forming layer 120 and the substrate 110 by irradiating a laser beam to one surface of the PCB 100 processed with the PSR layer 130, and evaporating and collecting the melts generated in the process. At this time, the laser beam may be one obtained by exciting the ground state electrons by applying electrical energy to an oscillator filled with, for example, carbon dioxide to amplify the induced and dissipated light.

The PSR layer 130 may reduce reflection of the laser beam and increase the absorption rate in the subsequent process, thereby improving roundness of the processed via hole, reducing energy consumption of the laser equipment, and improving the adhesion between the electrode forming layer 120 and the PSR layer 130.

The via hole 700 may be formed in an area corresponding to a position where the electronic element is to be mounted, in order to efficiently dissipate the heat generated by mounting the electronic element. In FIG. 8B, forming the via hole 700 in an area corresponding to a position where an electronic element is connected to the electrode forming layer 120 and mounted is illustrated as an example, and the via hole 700 may be formed at various positions.

FIG. 8C is a view illustrating that the conductive layer 140 is formed on the PCB 100 having the via hole 700. The conductive layer 140 formed of a conductive material may be formed to be covered on the surface where the via hole is formed, and a plurality of conductive plugs may be provided inside the via hole to dissipate the heat generated in the electronic element to the outside.

The via hole 700 as illustrated in FIGS. 8B and 8C are blind via holes. The blind via holes 820 which are processed by this method has an advantage in that the circuit density may be significantly improved than a through via hole through which the PCB 800 is completely penetrated.

However, the above-described structure is only one embodiment and is not limited thereto. For example, the via hole may be formed in a form of through via hole so as to connect the substrate 110 and the conductive layer 140 after being layered up to the conductive layer 140, instead of a form of the blind via hole 700.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A printed circuit board (PCB) comprising:
   a substrate;
   an electrode layer formed on the substrate;
   a photo solder resist (PSR) layer formed on a first area of an upper part of the electrode layer, the PSR layer having a first patterned structure; and
   a conductive layer formed on the PSR layer, the conductive layer having a second patterned structure that is the same as the first patterned structure, the conductive layer being configured to conduct heat and static electricity,
   wherein the electrode layer comprises a second area on which the PSR layer is not formed, and
   wherein the electrode layer is directly connected with a plurality of elements through the second area, without being connected with the conductive layer.

2. The PCB of claim 1, wherein the conductive layer comprises graphene material.

3. The PCB of claim 1, further comprising:
   a via hole which penetrates the PSR layer to connect the conductive layer and the electrode layer.

4. The PCB of claim 1, wherein the substrate comprises a flexible material, and
   wherein the plurality of elements comprise at least one micro light emitting diode (LED).

5. The PCB of claim 1, further comprising:
   a connecting element configured to connect the conductive layer with a ground layer of the PCB.

6. The PCB of claim 1, wherein the conductive layer is formed using an ink jet printing method.

7. The PCB of claim 1, wherein the conductive layer is formed using a lithography method.

8. The PCB of claim 1, wherein the conductive layer is formed using a silk screen method.

9. The PCB of claim 1, further comprising:
   the plurality of elements mounted on the second area of the side the PCB, the second area being different from the first area, and
   an additional conductive layer formed on a third area of the side of the PCB, the third area being different the first area and the second area, and the additional conductive layer being configured to conduct heat and static electricity.

10. The PCB of claim 1, further comprising:
    one or more electronic elements connected to the electrode layer in the second area.

11. The PCB of claim 10, wherein the one or more electronic elements are directly physically connected to the electrode layer in the second area where the PSR layer is not formed.

12. The PCB of claim 1, further comprising one or more micro light emitting diodes directly physically connected to the electrode layer in the second area where the PSR layer is not formed.

13. The PCB of claim 1, wherein the conductive layer covers an entire upper surface of the PSR layer.

14. The PCB of claim 1, wherein the first patterned structure is a mesh or a grid structure.

15. The PCB of claim 1, wherein a plurality of sides of at least one of the plurality of elements is surrounded by the conductive layer.

16. A printed circuit board (PCB) comprising:
- a substrate;
- an electrode layer formed on the substrate;
- a photo solder resist (PSR) layer formed in a first patterned manner on a first area of an upper part of the electrode layer; and
- a conductive layer formed on the PSR layer,
- the conductive layer having the a second patterned structure that is the same as the first patterned structure,
- and the conductive layer being configured to conduct heat and static electricity,
- wherein the electrode layer comprises a second area on which the PSR layer is not formed,
- wherein the electrode layer is connected with a plurality of elements through the second area, without being connected with the conductive layer, and
- wherein a plurality of sides of at least one of the plurality of elements is surrounded by the conductive layer.

\* \* \* \* \*